United States Patent
Mashino et al.

(10) Patent No.: US 6,433,415 B2
(45) Date of Patent: Aug. 13, 2002

(54) ASSEMBLY OF PLURALITY OF SEMICONDUCTOR DEVICES

(75) Inventors: Naohiro Mashino; Mitsuhiro Aizawa, both of Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/901,185

(22) Filed: Jul. 9, 2001

(30) Foreign Application Priority Data

Jul. 10, 2000 (JP) ........................................ 2000-207917

(51) Int. Cl.⁷ .............................................. H01L 23/02
(52) U.S. Cl. ...................... 257/686; 257/666; 257/676; 257/692; 257/723; 257/737; 257/738; 361/735; 361/784; 361/790
(58) Field of Search ................................ 257/686, 728, 257/724, 777, 666, 692, 676; 361/729, 735, 790; 438/109, 111

(56) References Cited

U.S. PATENT DOCUMENTS 6,239,496 B1 * 5/2001 Asada ........................ 257/777

FOREIGN PATENT DOCUMENTS

JP         A-6-268101        9/1994

* cited by examiner

*Primary Examiner*—Tom Thomas
*Assistant Examiner*—Patricia M. Costanzo
(74) *Attorney, Agent, or Firm*—Paul & Paul

(57) ABSTRACT

An assembly of semiconductor devices, wherein the device comprises a chip with electrodes on one side for electrical connection with an external circuit, and a flexible base comprising an insulation film having an inner opening and outer openings outside the inner opening, and the conductor pattern comprising a plurality of inner leads having an end extending to the inner opening of the film, and the outer leads being positioned to bridge the outer opening of the film; and the chip being mounted on the flexible base by bonding the lead-out electrodes thereof to the ends of inner leads, and wherein the devices are assembled to be connected with each other through the outer leads of semiconductor devices which are adjacent to each other, and the semiconductor chips, which face a substrate on which the assembly is to be mounted, have external connection electrodes, on which an external connection terminal for mounting is provided.

12 Claims, 6 Drawing Sheets

ASSEMBLY OF PLURALITY OF
SEMICONDUCTOR DEVICES

BACKGROUND OF THE INVENTION

1. Field of the invention

The invention relates to semiconductor devices and, in particular, to a novel assembly, of unit semiconductor devices, useful for the miniaturization of electronic appliances.

2. Description of the Related Art

An electronic appliance may comprise a semiconductor device or devices having a variety of functions. The semiconductor device or devices are mounted on a mounting substrate, such as a mother board, and are required to be mounted at an increasingly high density with a recent trend toward miniaturization of electronic appliances.

As a technique expected to fulfill this need, a three-dimensional mounting technique, in which a plurality of semiconductor devices, formed by encapsulating a semiconductor chip with a resin, are stacked, is known. According to this technique, a mounting substrate can gain an extra space in proportion to the number of stacked devices, and can occupy a reduced area accordingly. This may largely contribute to the miniaturization of electronic appliances.

Nevertheless, the three-dimensional mounting technique of the prior art suffers from difficulty in stacking semiconductor devices in the direction of thickness of a mounting substrate, and has not been practical.

SUMMARY OF THE INVENTION

The invention is directed at providing a novel assembly of semiconductor devices, which is useful for the miniaturization of electronic appliances, and is different from those of prior art.

According to the invention, there is provided an assembly of semiconductor devices, wherein the semiconductor device comprises a semiconductor chip and a flexible base, the semiconductor chip being provided with lead-out electrodes on one side thereof for electrical connection with an external circuit, and the flexible base comprising an insulation film and a conductor pattern, the insulation film having an inner opening and outer openings arranged outside the inner opening, and the conductor pattern being located on one side of the insulation film, and comprising a plurality of pairs of an inner lead and an outer lead, the inner and outer leads in each pair being connected with each other, the inner lead having an end extending to the inner opening of the insulation film and being exposed therein, and the outer leads being positioned so as to bridge the outer opening of the insulation film and being exposed therein; and the semiconductor chip being mounted on the flexible base by bonding the lead-out electrodes thereof to the ends of inner leads exposed in the inner opening of the insulation base, and wherein the semiconductor devices are assembled to be connected with each other through the outer leads of semiconductor devices which are adjacent to each other, and the semiconductor chip or chips, which face a substrate on which the assembly is to be mounted, have external connection electrodes, on which an external connection terminal for mounting is provided.

In a first embodiment, the assembly of semiconductor devices of the invention comprises a stack of semiconductor devices.

In a second embodiment, the assembly of semiconductor devices of the invention comprises semiconductor devices arranged in a plane.

Preferably, the flexible base has an insulation film of polyimide and a conductor pattern of copper or copper alloy.

Preferably, the outer lead of the conductor pattern has a larger width than the width of the inner lead of the conductor pattern.

Preferably, the outer leads of semiconductor devices which are adjacent to each other are bonded together by solder.

More preferably, a metal layer-enhancing the wettability of the outer lead by a solder material is provided on the outer leads of the semiconductor device. For this purpose, the outer leads of the semiconductor device may be provided thereon with a layer of aluminum, a layer of gold, a combination of layers of aluminum and silver, a combination of layers of aluminum and gold, a combination of layers of nickel and gold, or a combination of layers of nickel and palladium.

Preferably, the outer leads of semiconductor devices which are adjacent to each other are bonded together by use of an anisotropic conductive film.

BRIEF DESCRIPTION OF THE DRAWINGS

The above and other objects and advantages of the invention will be well understood and appreciated by a person with ordinary skill in the art, from consideration of the following detailed description made by referring to the attached drawings, wherein.

DETAILED DESCRIPTION OF THE INVENTION

A first embodiment of the assembly of semiconductor devices of the invention is described by referring to FIGS. 1 to 5 which sequentially illustrate the manufacture of the-assembly of semiconductor devices.

Figure 1:
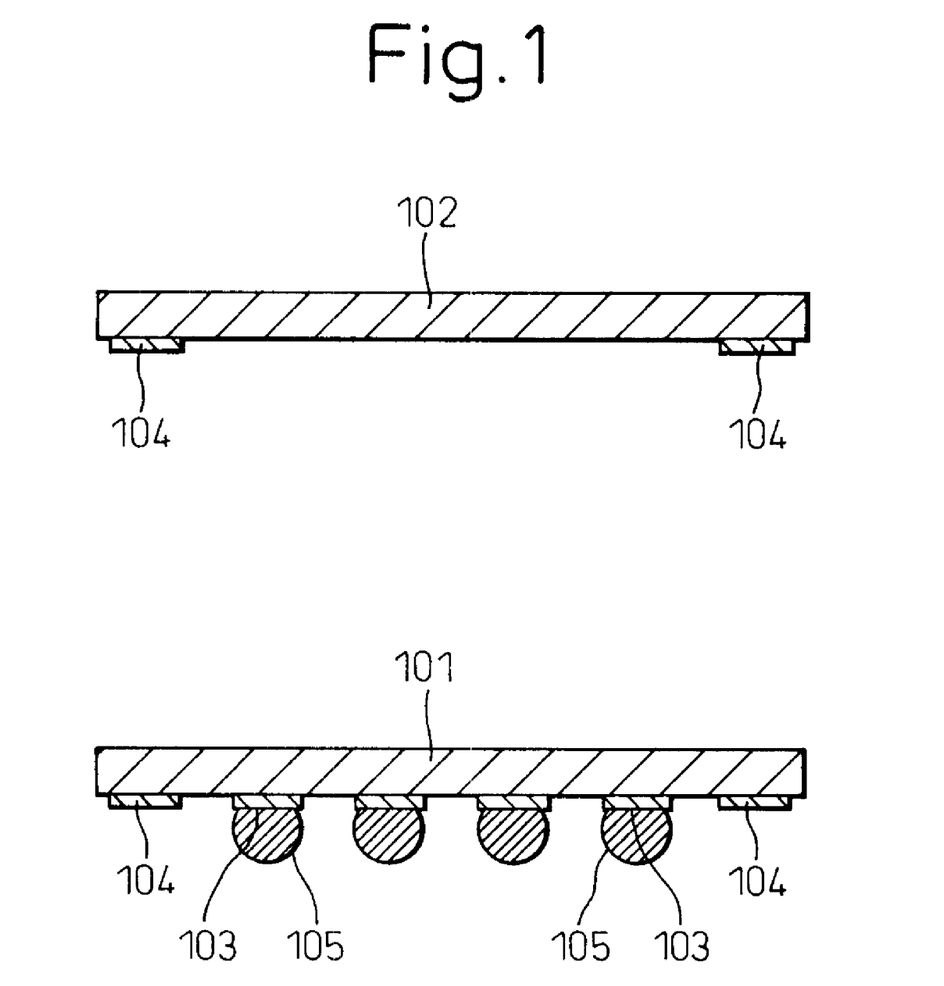
FIG. 1 illustrates cross sections of two types of semiconductor chips used in an assembly of unit semiconductor devices of the first embodiment of the invention.

The assembly of this embodiment described herein referring to FIGS. 1 to 5 comprises two semiconductor chips 101 and 102, as shown in the drawings. Accordingly, two semiconductor chips 101 and 102,are first provided, as illustrated in FIG. 1. One of them, the semiconductor chip 101, has a circuit-forming side at which circuits are formed and, on this side, external connection electrodes 103 and lead-out electrodes 104 are also provided. The external connection electrodes 103 are used to input a signal from a mounting substrate (not shown) to the semiconductor chip 101, and vice versa, or supply electrical power from the substrate to the chip 101 or another similar purpose. On the surface of the external connection electrode 103, a solder bump (external connection terminal) 105 is fixed. The lead-out electrodes 104 are used for an exchange of signals between the semiconductor chips 101 and 102, or electrical power supply.

The external connection electrodes 103 and the lead-out electrodes 104 are formed as follows. First, the circuit-forming side of the semiconductor chip 101 is plated with copper. The resultant layer of plated copper is then patterned, and the patterned plated copper is plated with nickel. Subsequently, a layer of gold is formed on the layer of plated nickel to provide the finished external connection electrodes 103 and lead-out electrodes 104. The formation of the layers of nickel and gold can enhance a strength of bond between the external connection electrode 103 and the solder bump 105.

Alternatively, the external connection electrodes 103 and the lead-out electrodes 104 may be formed by forming a patterned insulation layer (not shown) on the circuit-forming side of the semiconductor chip 101, and forming, on the insulation layer, a patterned layer of rerouted wiring lines, each of which is connected, at one end, with an electrode of the semiconductor chip 101 thorough a patterned opening of the insulation layer, and is connected, at another end, with the external connection electrode 103 or lead-out electrode 104. In this case, the insulation layer is formed of a resin such as polyimide. Subsequently, a patterned film of copper or copper alloy is formed on the insulation layer, and is plated successively with nickel and gold to simultaneously provide the rerouted wiring lines (not shown) and the external connection and lead-out electrodes 103, 104.

The semiconductor chip 102 also has a circuit-forming side on which lead-out electrodes 104 are provided. Each lead-out electrode 104 of the semiconductor chip 102 is connected with one of the lead-out electrodes 104 of the semiconductor chip 101 later, to establish electrical connection between both chips 101 and 102.

Figure 2A:
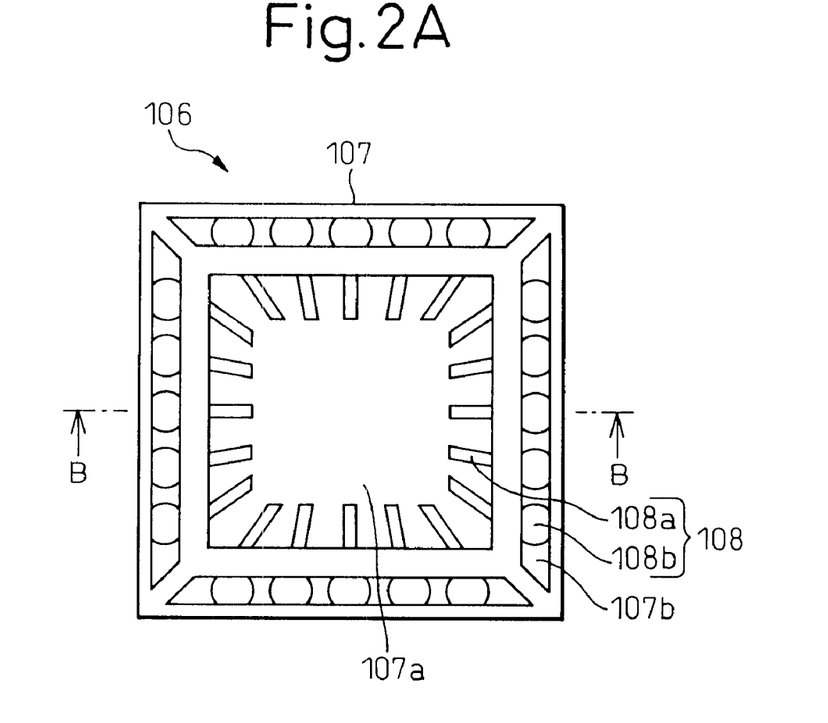
FIG. 2A is a plan view of a flexible base used in the invention.

A flexible base 106, which is illustrated in a plan view of FIG. 2A, is then provided for each of semiconductor chips 101 and 102. The flexible base 106 is made by forming a conductor pattern 108 of copper or the like on one side of an insulation film 107 of polyimide or the like, the conductor pattern 108 comprising a plurality of pairs of an inner lead 108a and an outer lead 108b, the inner and outer leads 108a and 108b in each pair being connected with each other. The insulation film 107 has a device hole 107a and window holes 107b. The flexible base used in the invention may be made using materials such as those known as TAB (tape automated bonding) tapes.

An end of the inner lead 108a of the conductor pattern 108 extends to the opening of the device hole 107a, and is exposed therein. The respective ends of inner leads 108a exposed in the opening of the device hole 107a are at the locations corresponding to the locations of the respective lead-out electrodes 104 of the semiconductor chip 101 or 102 (FIG. 1).

The outer lead 108b of the conductor pattern 108 is generally in the form of circle, and is positioned so as to bridge the opening of the window hole 107b, and is exposed therein. In general, the outer lead 108b has a width (diameter) which is larger compared to a width of the inner lead 108a, as illustrated in FIG. 2A.

Figure 2B:
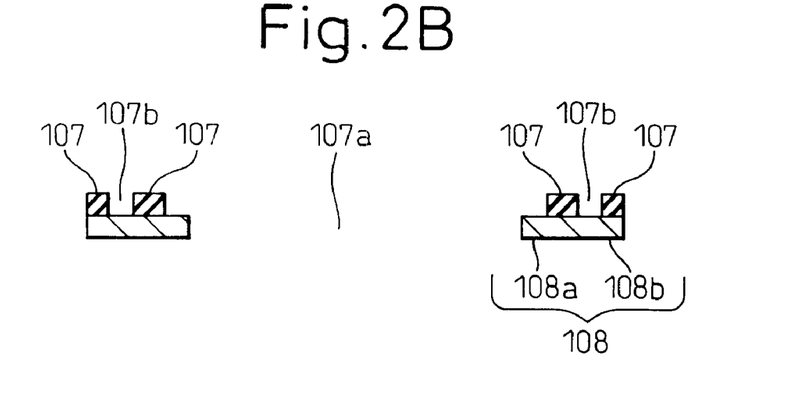
FIG. 2B is a cross sectional view of the flexible base taken along the line B—B of FIG. 2A.

A cross sectional view of the flexible base 106 taken along the line B—B of FIG. 2A is shown in FIG. 2B.

Figure 3:
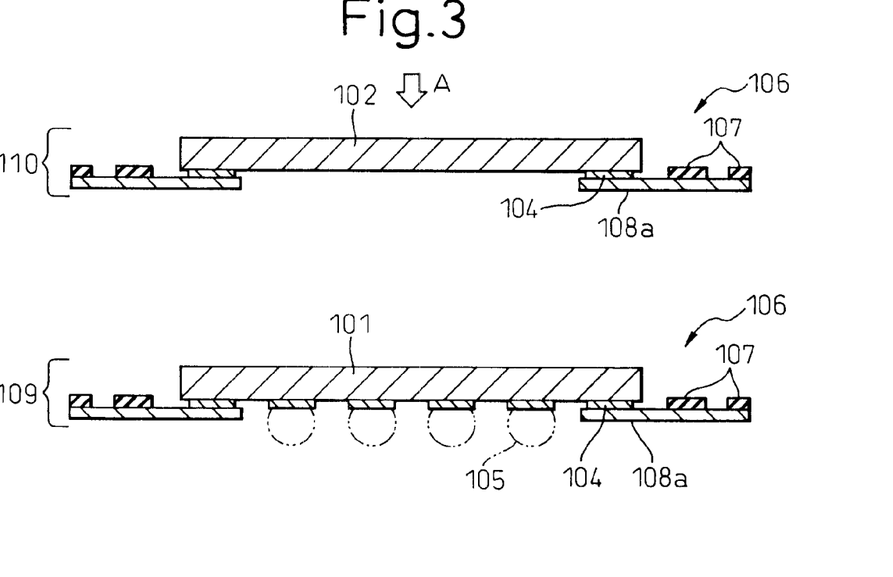
FIG. 3 illustrates cross sections of two types of unit semiconductor-devices in the assembly of the first embodiment of the invention.

Each of the semiconductor chips 101 and 102 (FIG. 1) is then mounted on the flexible base 106 (FIG. 2A) by bonding the lead-out electrodes 104 of the semiconductor chip 101 or 102 to the ends of the inner leads 108a of the flexible base 106, as illustrated in FIG. 3, to thereby establish electrical connection between the chip 101 or 102 and the flexible base 106. The bonding is carried out by bringing the lead-out electrode 104 of the semiconductor chip 101 (or 102) into contact with the end-of the inner lead 108a of the flexible base 106, and irradiating the contact (the end of the inner lead 108a ) with a laser beam to thereby melt the lead-out electrode 104 of the chip 101 (or 102) and the end of the inner lead 108a of the base 106. Alternatively, they may be bonded together by hot pressing, ultrasonic welding or the like. Also, they may be bonded using a film of anisotropic conductive material (not shown) located between the lead-out electrode 104 of the chip 101 (or 102) and the end of the inner lead 108a of the base 106, the film bonding them together after pressing. In general, the solder bumps (external connection terminals) 105 on the lower chip 101 are formed after combining the lower and upper chips 101 and 102 together to provide an assembly or stack of the unit semiconductor devices, as described below.

In this way, a unit semiconductor device 109 made up of the semiconductor chip 101 and the flexible base 106, and another unit semiconductor device 110 made up of the semiconductor chip 102 and the flexible base 106, are obtained.

Figure 4:
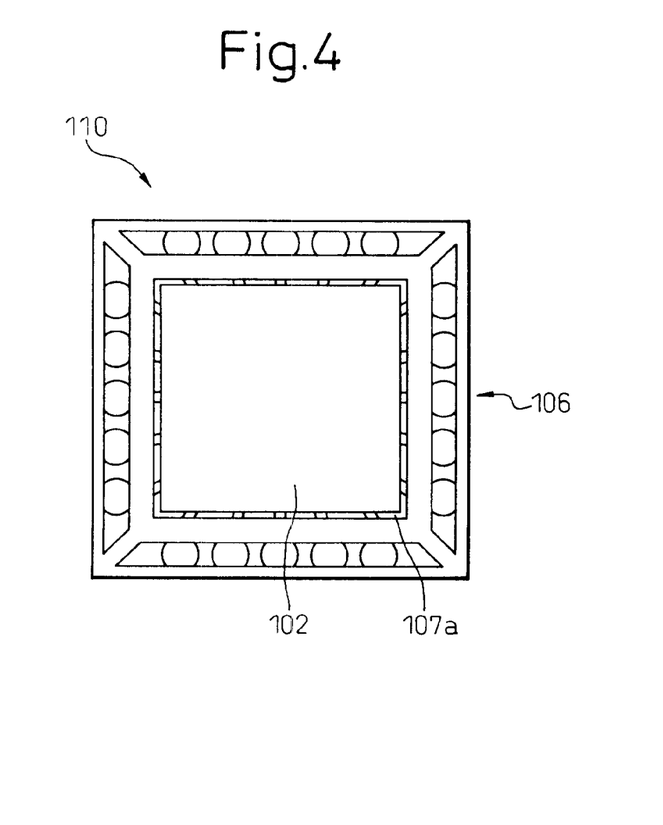
FIG. 4 is a top view of the unit semiconductor device in the invention.

FIG. 4 illustrates the unit semiconductor device thus obtained. This drawing represents a top view of the unit semiconductor device 110 looking down in the direction indicated by the arrow A of FIG. 3. It can be understood that the unit semiconductor device 109 also presents the same plan view as that shown in FIG. 3 when looking down in the same direction as for the semiconductor device 110. As shown, the semiconductor chip 102 is located in the area of the device hole 107a of-the flexible base 106.

Figure 5:
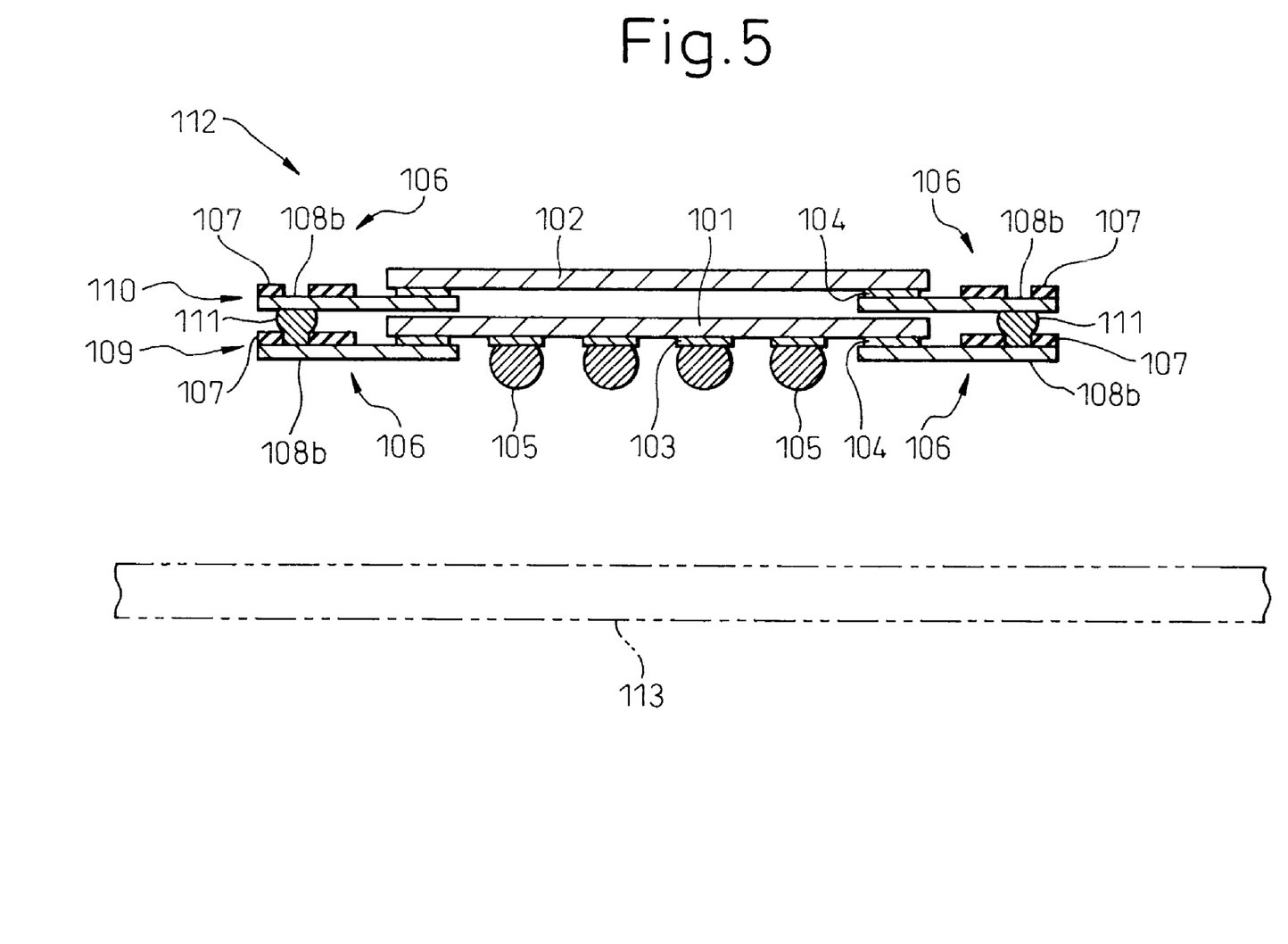
FIG. 5 illustrates an assembly of unit semiconductor devices of the first embodiment of the invention.

One unit semiconductor device 110 is then laid on another unit semiconductor device 109 to provide an assembly or stack 112 of the unit semiconductor devices, as shown in FIG. 5. The unit semiconductor devices 109 and 110 are electrically connected with each other by bonding the outer leads 108b of them, which are opposite to each other, by interposing a solder ball 111 therebetween and reflowing it. In general, the solder bumps 105 on the lower chips 101 are formed after combining the lower and upper chips 101 and 102 together to provide the stack of the unit semiconductor devices 109 and 110, in order to avoid the effect of heating or the like on the bumps 105 during the reflow of solder balls 111 interposed between the lower and upper unit semiconductor devices 109 and 110.

In the embodiment shown in FIG. 5, the lead-out electrodes 104 are arranged in the peripheral region of the semiconductor chips 101 and 102, and, in the region surrounded by the region in which lead-out electrodes 104 are arranged, the external connection electrodes 103 of the lower chip 101, on which the solder bumps (external connection terminals) 105 are to be provided, are arranged.

As earlier described, the outer lead 108b has, in general, a size (diameter) larger compared to a width of the inner lead 108a, which makes it easier to position the solder ball 111 on the outer lead 108b of the lower unit semiconductor device 109. In addition, a metal layer (not shown), which enhances wettability of the outer lead 108b by a solder material, can be provided on the outer lead 108b of the lower semiconductor device 109 prior to supplying the solder ball 111 thereonto, to thereby improve the reliability of connection of lower and upper unit semiconductor devices 109 and 110 through the reflowed solder ball 111. The metal layer enhancing the wettability of the outer lead, using a solder material, may be also provided on the outer lead 108b of the upper unit semiconductor device 110. The enhancement of wettability of the outer lead 108b, using a solder material, can be attained by the use of, for example, a layer of aluminum, a layer of gold, a combination of layers of aluminum and silver, a combination of layers of aluminum and gold, a combination of layers of nickel and gold, and a combination of layers of nickel and palladium.

The way of bonding the outer leads 108b of the lower and upper semiconductor devices 109 and 110 to each other is not limited to the use of a solder ball as described above, and the bonding can be effected by any other way. For example, they may be bonded to each other by hot pressing, ultrasonic welding or the like. It is also possible to bond the outer leads 108b of the lower and upper semiconductor devices 109 and 110 to each other by use of an anisotropic conductive film.

The resultant assembly 112 is mounted on a mounting substrate 113 by positioning the assembly 112 on the substrate 113, which is depicted in FIG. 5 by the fictitious outline, in such a manner that the side of the assembly 112 provided with the solder balls 105, as the external connection terminals, faces the substrate 113, and reflowing the solder bumps 105. It is also possible to obtain an assembly of three or more unit semiconductor devices. In this case, a lowermost unit semiconductor device represents the lower unit semiconductor device 109 in the embodiment described above, and a semiconductor chip thereof has external connection electrodes, lead-out electrodes, and solder bumps provided on the external connection electrodes; other unit semiconductor devices represent the upper unit semiconductor device 110, and a semiconductor chip of each of the unit semiconductor devices has only lead-out electrodes.

In the assembly 112, a spacer may be interposed between the semiconductor chip 101 of the lower unit semiconductor device 109 and the semiconductor chip 102 of the upper unit semiconductor device 110. The spacer may be formed of an adhesive material or a film such as those commonly used in the semiconductor industry. It is also useful to provide, as the spacer, a layer of an elastic material between the semiconductor chip 101 of the lower unit semiconductor device 109 and the semiconductor chip 102 of the upper unit semiconductor device 110. In this case, the layer of an elastic material serves to keep a distance between the lower and upper chips 101 and 102, and also to relax a stress which can be occurs between the lower and upper chips 101 and 102. Also, an underfiller may be used to fill the space between the lower unit semiconductor device 109 and the mounting substrate 113.

As described above, the assembly of the first embodiment of the invention, in which one unit semiconductor device is laid on another in succession to form a stack of two or more unit semiconductor devices, is mounted on a mounting substrate. Thus, the mounting of the assembly of the invention on a substrate represents a so-called three-dimensional mounting technique as earlier described.

In the prior three-dimensional mounting technique, a plurality of semiconductor devices formed by encapsulating a semiconductor chip with a resin material are stacked, as earlier referred to. In contrast, the assembly 112 of unit semiconductor devices of the invention has a structure in which semiconductor chips 101, 102, which are not encapsulated with a resin, are stacked, as illustrated in FIG. 5. According to the structure in the invention, the assembly 112 can have a height smaller than that of the prior stack of semiconductor devices because of the elimination of encapsulating resin material. This largely contributes to the miniaturization of electronic appliances containing the assembly of semiconductor devices of the invention.

By using thin chips as semiconductor chips which form the unit semiconductor devices in the invention, the effect described above becomes much remarkable. Semiconductor chips which are not thin typically have a thickness of about 0.6 to 0.7 millimeter, whereas thin semiconductor chips have a thickness of down to about 50 micrometers. The use of such thin semiconductor chips makes it possible to actually provide a three-dimensional structure of stacked semiconductor devices having a very small thickness on a mounting substrate.

In addition, in the assembly 112 of the first embodiment of the invention illustrated in FIG. 5, the electrical connection between the two semiconductor chips 101 and 102 is effected only through the flexible bases 106. Accordingly, the assembly 112 can have a small wiring distance between the two semiconductor chips 101 and 102 compared to the case where semiconductor chips are connected to each other through a multilayer wiring board or the like. In the assembly 112 having such a small wiring distance, decrease in operating speed of semiconductor chips due to the wiring distance can be restrained. This largely contributes to satisfying a recent demand for high speed semiconductor devices. By way of example, using a central processing unit (CPU) and a cache memory as the semiconductor chips 101 and 102, the assembly 112 is formed into an arithmetic processing system having a high processing speed and a reduced operating delay.

Of course, these effects of the assembly of the first embodiment of the invention can be also obtained when the assembly comprises three or more stacked semiconductor chips.

Figure 6:
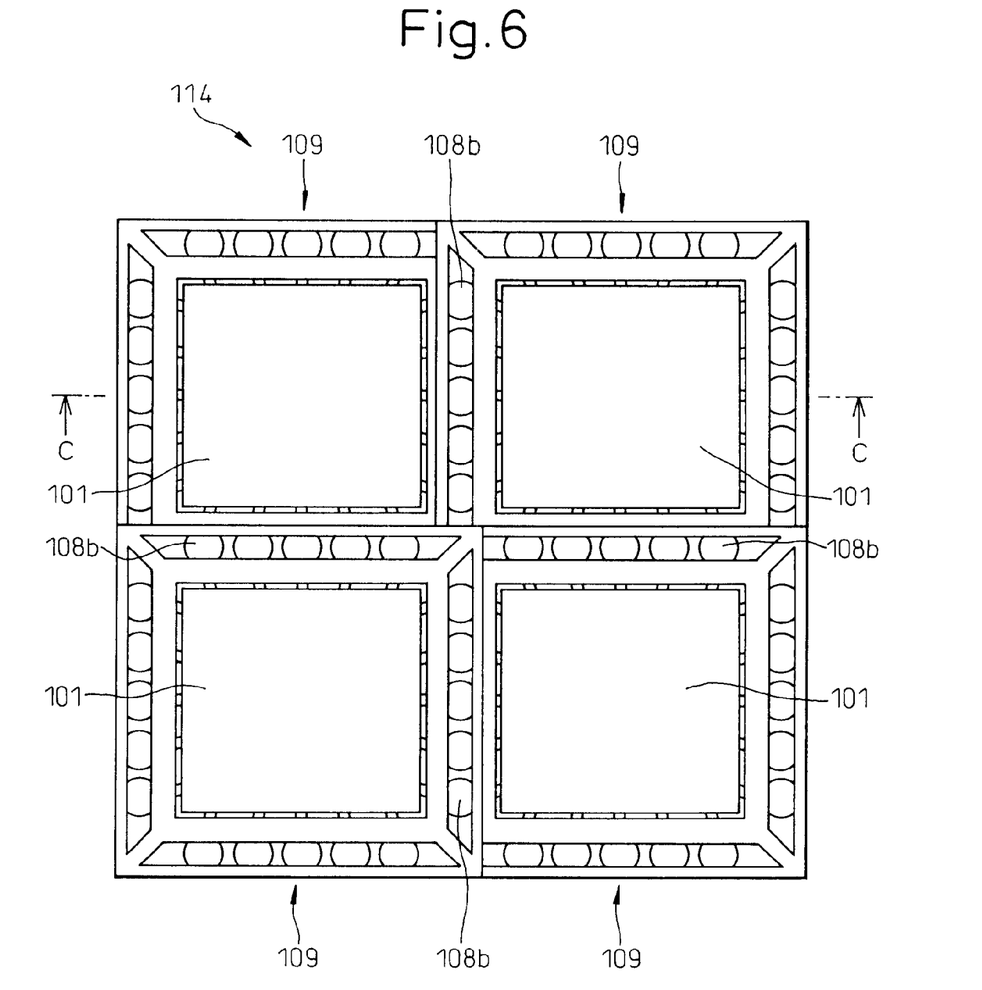
FIG. 6 is a plan view of an assembly of unit semiconductor devices of the second embodiment of the invention.
Figure 7:
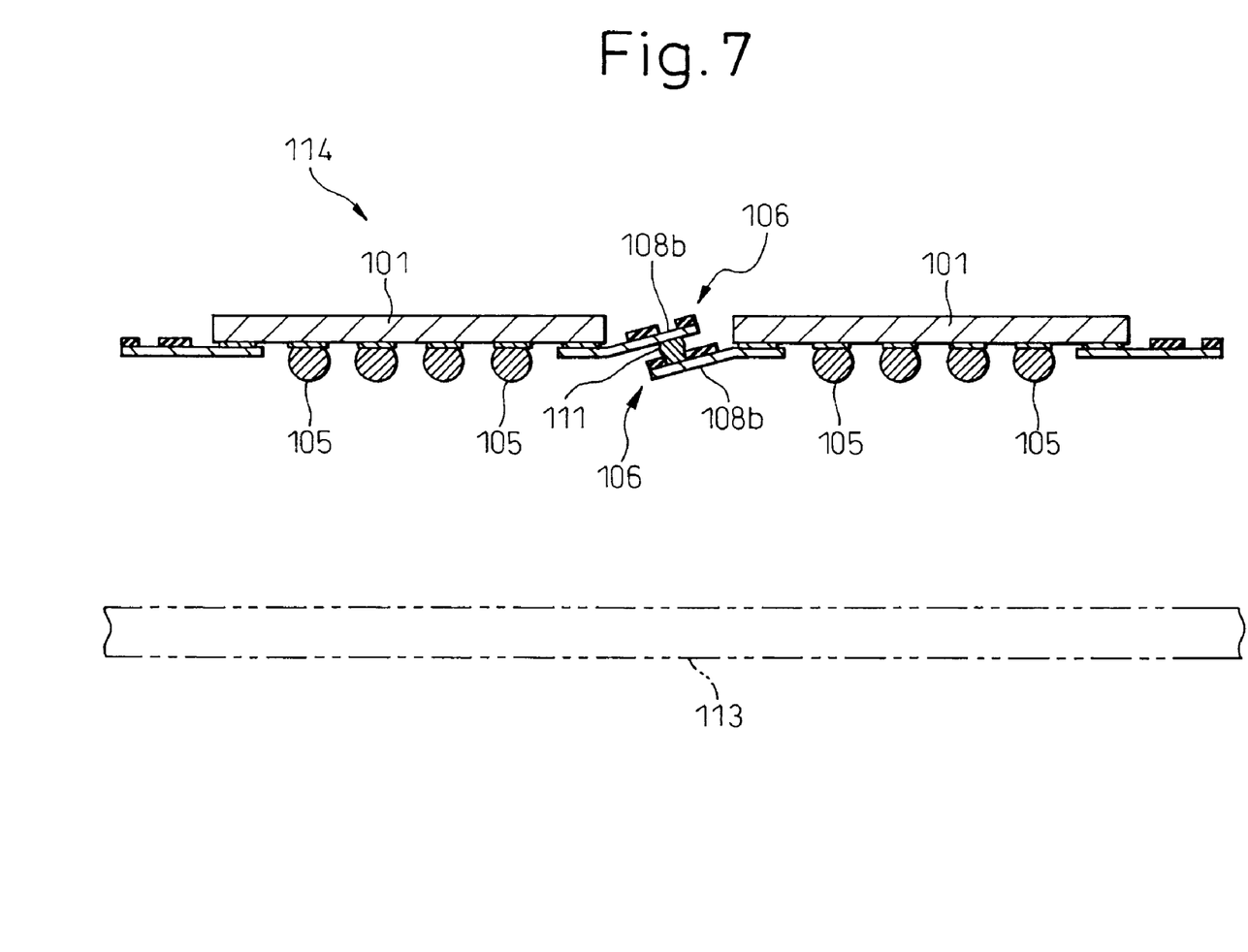
FIG. 7 is a cross sectional view of the assembly shown in FIG. 6, taken along the line C—C in FIG. 6.

A second embodiment of the assembly of semiconductor devices of the invention will now be described by referring to FIGS. 6 and 7 which show a plan view of an assembly of the second embodiment and a cross sectional view of the assembly shown in FIG. 6 taken along the line C—C of FIG. 6, respectively. In FIGS. 6 and 7, the same members as those described for the first embodiment have the same reference numerals as those allotted to the members formerly described, and these members are not explained in the following description.

An assembly 114 of the second embodiment of the invention illustrated in FIG. 6 is made by arranging four unit semiconductor devices 109 (FIG. 3) as earlier described in a plane so as to be in the form of square or almost square, and bonding opposed outer leads 108b of the adjacent unit semiconductor devices 109 to each other.

As earlier described, and as shown in FIG. 7, the bonding is effected by interposing a solder ball 111 between the opposed outer leads 108b of the adjacent unit semiconductor devices 101, and reflowing it.

Also in the second embodiment, a metal layer on the outer lead 109 can enhance the wettability thereof by a solder material. For this purpose, a layer of metal or a combination of metal layers, as referred to above, can be used. The bonding of the outer leads 108b of the adjacent unit semiconductor devices 109 may be also effected by hot pressing, ultrasonic welding or the like. An anisotropic conductive film may be also used for the bonding of the outer leads 108b of the adjacent unit semiconductor devices 109.

The resultant assembly 114 is also mounted on a mounting substrate 113, as in the mounting of the assembly 112 of the first embodiment. An underfiller may be used to fill the space between the assembly 114 and the mounting substrate 113.

In the assembly 114 of the second embodiment of the invention, the semiconductor chips 109 are not encapsulated with a resin material and, accordingly, the assembly 114 as well as the unit semiconductor devices 109 can have a smaller thickness compared to a common encapsulated semiconductor device. Specifically, the assembly 114 of the second embodiment of the invention has a thickness which is approximately equal to the sum of a thickness of the semiconductor chip 101 and a height of the solder bump 105, as seen in FIG. 7. Using a semiconductor chip having a thickness of about 0.6 millimeter, which is typical for most semiconductor chips commonly used at present, and a solder ball having a height of about 50 micrometers, the resultant assembly 114 of the second embodiment of the invention has a thickness which does not reach even 0.7 millimeter. The thickness of the assembly 114 is markedly small compared to that of a semiconductor device obtained by encapsulating a semiconductor chip having a similar thickness (about 0.6 millimeter) with a resin material.

In addition, by using thin chips having a thickness of down to about 50 micrometers, as described above, the assembly 114 of the second embodiment of the invention can have a reduced thickness of down to about 0.1 millimeter. Using the assembly 114 having such a small thickness, an electronic appliance containing the assembly 114 mounted on a substrate requires a markedly small space to house them therein.

Further, as can be seen in FIG. 7, in the assembly 114 of the second embodiment of the invention, the electrical connection between the adjacent semiconductor chips 101 is effected only through the flexible bases 106 carrying the respective chips 101. Accordingly, the assembly 114 can have a small wiring distance between the adjacent semiconductor chips 101 compared to the case where semiconductor chips are connected to each other through a multilayer wiring board or the like. In the assembly 114 having such a small wiring distance, the decrease in operating speeds of semiconductor chips due to the wiring distance can be restrained, as in the assembly 112 of the first embodiment of the invention. This largely contributes to providing an assembly of semiconductor devices of high speed. By way of example, using a CPU as one of the semiconductor chips 101 and cache memories as the other of the semiconductor chips 101, the assembly 114 is formed into an arithmetic processing system having a high processing speed and a reduced operating delay, as in the assembly 112 of the first embodiment of the invention.

The assembly 114 containing a plurality of semiconductor chips of different types, such as a CPU and a cache memory as referred to above, arranged in a plane, is novel. There is a possibility that the development of such an assembly is proceeded with in future because of its useful effects as described above, and the invention can be expected to be a basis therefor and largely contribute thereto.

Of course; the assembly of the second embodiment of the invention can also contain any number of unit semiconductor devices arranged in a plane.

What is claimed is:

1. An assembly of semiconductor devices, wherein the semiconductor device comprises a semiconductor chip and a flexible base, the semiconductor chip being provided with lead-out electrodes on one side thereof for electrical connection with an external circuit, and the flexible base comprising an insulation film and a conductor pattern, the insulation film having an inner opening and outer openings arranged outside the inner opening, and the conductor pattern being located on one side of the insulation film, and comprising a plurality of pairs of an inner lead and an outer lead, the inner and outer leads in each pair being connected with each other, the inner lead having an end extending to the inner opening of the insulation film and being exposed therein, and the outer leads being positioned so as to bridge the outer opening of the insulation film and being exposed therein; and the semiconductor chip being mounted on the flexible base by bonding the lead-out electrodes thereof to the ends of inner leads exposed in the inner opening of the insulation base, and wherein the semiconductor devices are assembled to be connected with each other through the outer leads of semiconductor devices which are adjacent to each other, and the semiconductor chip or chips, which face a substrate on which the assembly is to be mounted, have external connection electrodes, on which an external connection terminal for mounting is provided.

2. The assembly of semiconductor devices of claim 1, wherein the semiconductor devices are formed into a stack.

3. The assembly of semiconductor devices of claim 1, wherein the semiconductor devices are arranged in a plane.

4. The assembly of semiconductor devices of claim 1, wherein the flexible base has an insulation film of polyimide and a conductor pattern of copper or copper alloy.

5. The assembly of semiconductor devices of claim 1, wherein the outer lead of the conductor pattern has a larger width than the width of the inner lead of the conductor pattern.

6. The assembly of semiconductor devices of claim 1, wherein the outer leads of semiconductor devices which are adjacent to each other are bonded together by solder.

7. The assembly of semiconductor devices of claim 5, wherein the outer leads of semiconductor devices which are adjacent to each other are bonded together by solder.

8. The assembly of semiconductor devices of claim 6, wherein a metal layer enhancing wettability of the outer lead by a solder material is provided on the outer leads of the semiconductor device.

9. The assembly of semiconductor devices of claim 7, wherein a metal layer enhancing wettability of the outer lead by a solder material is provided on the outer leads of the semiconductor device.

10. The assembly of semiconductor devices of claim 6, wherein the outer leads of the semiconductor devices are provided thereon with a layer of aluminum, a layer of gold, a combination of layers of aluminum and silver, a combination of layers of aluminum and gold, a combination of layers of nickel and gold, or a combination of layers of nickel and palladium.

11. The assembly of semiconductor devices of claim 7, wherein the outer leads of the semiconductor devices are provided thereon with a layer of aluminum, a layer of gold, a combination of layers of aluminum and silver, a combination of layers of aluminum and gold, a combination of layers of nickel and gold, or a combination of layers of nickel and palladium.

12. The assembly of semiconductor devices of claim 1, wherein the outer leads of semiconductor devices which are adjacent to each other are bonded together by use of an anisotropic conductive film.

* * * * *